United States Patent
Park et al.

(10) Patent No.: US 12,284,865 B2
(45) Date of Patent: Apr. 22, 2025

(54) DISPLAY PANEL AND METHOD OF MANUFACTURING THE SAME

(71) Applicant: Samsung Display Co., Ltd., Yongin-si (KR)

(72) Inventors: Hyungjun Park, Yongin-si (KR); Minjeong Kim, Yongin-si (KR); Junyong An, Yongin-si (KR); Nuree Um, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 424 days.

(21) Appl. No.: 17/655,758

(22) Filed: Mar. 21, 2022

(65) Prior Publication Data

US 2022/0310972 A1    Sep. 29, 2022

(30) Foreign Application Priority Data

Mar. 24, 2021    (KR) .................. 10-2021-0038281

(51) Int. Cl.
*H10K 71/00*    (2023.01)
*H10K 50/844*    (2023.01)
(Continued)

(52) U.S. Cl.
CPC .......... *H10K 50/844* (2023.02); *H10K 59/40* (2023.02); *H10K 59/65* (2023.02); *H10K 71/00* (2023.02);
(Continued)

(58) Field of Classification Search
CPC ...... H10K 50/844; H10K 59/40; H10K 59/65; H10K 71/00; H10K 59/1201;
(Continued)

(56) References Cited

U.S. PATENT DOCUMENTS 10,840,478 B2    11/2020    Han et al.
10,862,068 B2    12/2020    Choi et al.
(Continued)

FOREIGN PATENT DOCUMENTS

KR    10-2014-0017854 A    2/2014
KR    10-2020-0037025 A    4/2020
(Continued)

*Primary Examiner* — Sheikh Maruf
(74) *Attorney, Agent, or Firm* — Womble Bond Dickinson (US) LLP

(57) ABSTRACT

A display panel and a method of manufacturing the display panel are provided. The display panel includes: a substrate including a transmission area, a display area surrounding the transmission area, and an intermediate area between the transmission area and the display area; a light emitting device; and a groove in the intermediate area and including a first opening of a metal layer including a first sublayer, a second sublayer, and a third sublayer sequentially stacked and a second opening of an inorganic layer covering the metal layer, wherein the first opening includes a first opening of the first sublayer, a second opening of the second sublayer, and a third opening of the third sublayer, which overlap each other, and an inner surface of the second sublayer includes a concave portion recessed in a direction farther away from a center of the first opening than an inner surface of the first sublayer and an inner surface of the third sublayer.

10 Claims, 12 Drawing Sheets

(51) Int. Cl.
*H10K 59/40* (2023.01)
*H10K 59/65* (2023.01)
*G06F 3/044* (2006.01)
*H10K 59/12* (2023.01)

(52) U.S. Cl.
CPC .......... *G06F 3/044* (2013.01); *H10K 59/1201* (2023.02)

(58) Field of Classification Search
CPC ............... H10K 59/131; H10K 59/873; H10K 59/8731; H10K 59/1213; H10K 59/124; H10K 59/122; H10K 59/88; G06F 3/044; G06F 3/0412
USPC ........................................................ 257/295
See application file for complete search history.

(56) References Cited

U.S. PATENT DOCUMENTS

| | | | |
|---|---|---|---|
| 11,244,994 B2* | 2/2022 | Xu | H10K 77/111 |
| 2005/0273292 A1* | 12/2005 | Severson | G01K 13/02 |
| | | | 374/E13.006 |
| 2016/0172608 A1* | 6/2016 | Xie | H10K 10/464 |
| | | | 257/40 |
| 2016/0204373 A1* | 7/2016 | Park | H10K 59/124 |
| | | | 257/40 |
| 2017/0148856 A1* | 5/2017 | Choi | H10K 59/873 |
| 2017/0288004 A1* | 10/2017 | Kim | H10K 59/124 |
| 2018/0166525 A1* | 6/2018 | Kim | H10K 59/122 |
| 2018/0174515 A1* | 6/2018 | Joo | H10K 71/12 |
| 2019/0051859 A1* | 2/2019 | Choi | H10K 59/1213 |
| 2019/0148672 A1* | 5/2019 | Seo | H10K 50/8445 |
| | | | 257/40 |
| 2019/0288047 A1* | 9/2019 | Jeong | H10K 71/00 |
| 2020/0006701 A1* | 1/2020 | Lee | H10K 50/844 |
| 2020/0119304 A1* | 4/2020 | Choi | H10K 59/12 |
| 2020/0235180 A1 | 7/2020 | Park et al. | |
| 2020/0235333 A1 | 7/2020 | Sung et al. | |
| 2020/0312933 A1* | 10/2020 | Lee | H10K 59/8731 |
| 2021/0126067 A1* | 4/2021 | Xu | H10K 59/131 |
| 2021/0193751 A1* | 6/2021 | Jang | H10K 50/844 |
| 2021/0210725 A1* | 7/2021 | Choi | H10K 59/8731 |

FOREIGN PATENT DOCUMENTS

| | | |
|---|---|---|
| KR | 10-2020-0041420 A | 4/2020 |
| KR | 10-2020-0091050 A | 7/2020 |
| KR | 10-2020-0115943 A | 10/2020 |

* cited by examiner

DISPLAY PANEL AND METHOD OF MANUFACTURING THE SAME

CROSS-REFERENCE TO RELATED APPLICATION

The present application claims priority to and the benefit of Korean Patent Application No. 10-2021-0038281, filed on Mar. 24, 2021, in the Korean Intellectual Property Office, the entire disclosure of which is incorporated by reference herein.

BACKGROUND

1. Field

Aspects of one or more embodiments relate to a display panel and a method of manufacturing the same.

2. Description of the Related Art

Recently, display apparatuses have been used for various purposes. Also, as display apparatuses have become thinner and lighter, their range of use has widened.

As an area occupied by a display area in a display apparatus has been expanded, various functions combined or associated with a display apparatus have been added. As a method of adding various functions while increasing the area, research has been conducted into a display apparatus having an area for adding various functions other than displaying images inside a display area.

The above information disclosed in this Background section is only for enhancement of understanding of the background and therefore the information discussed in this Background section does not necessarily constitute prior art.

SUMMARY

Aspects of one or more embodiments relate to a display panel and a method of manufacturing the same, and for example, to a display panel including a transmission area and a method of manufacturing the same.

A display panel including a transmission area in some systems may have a problem in that a defect may occur due to moisture penetration in the transmission area.

Thus, some embodiments according to the present disclosure may relate to a display panel having an improved moisture penetration prevention performance and a display panel having a relatively improved process efficiency, and a method of manufacturing the display panel. However, these problems are merely examples and the scope of embodiments according to the present disclosure are not limited thereto.

Additional aspects will be set forth in part in the description which follows and, in part, will be apparent from the description, or may be learned by practice of the presented embodiments.

According to one or more embodiments, a display panel includes a substrate including a transmission area, a display area surrounding the transmission area, and an intermediate area between the transmission area and the display area, a light emitting device in the display area, and a groove in the intermediate area and including a first opening of a metal layer including a first sublayer, a second sublayer, and a third sublayer sequentially stacked and a second opening of an inorganic layer covering the metal layer, wherein the first opening includes a first sub-opening of the first sublayer, a second sub-opening of the second sublayer, and a third sub-opening of the third sublayer, which overlap each other, and an inner surface of the second sublayer includes a concave portion recessed in a direction farther away from a center of the first opening than an inner surface of the first sublayer and an inner surface of the third sublayer.

According to some embodiments, the light emitting device may include a first electrode, a second electrode, and an intermediate layer between the first electrode and the second electrode, and at least one common layer included in the intermediate layer may be disconnected by the groove.

According to some embodiments, an edge of an upper surface of the second sublayer in a center direction of the second sub-opening may match an edge of a lower surface of the third sublayer in a center direction of the third sub-opening, and an edge of a lower surface of the second sublayer in a center direction of the second sub-opening may match an edge of an upper surface of the first sublayer in a center direction of the first sub-opening.

According to some embodiments, a width of the third sub-opening may be greater than a width of the first sub-opening.

According to some embodiments, an edge of an upper surface of the third sublayer in a center direction of the third sub-opening may match an edge of a lower surface of the inorganic layer in a center direction of the second opening.

According to some embodiments, the display panel may further include a thin film transistor located in the display area and electrically connected to the light emitting device, wherein each of a source electrode and a drain electrode of the thin film transistor may include a first conductive layer, a second conductive layer, and a third conductive layer, which are sequentially stacked.

According to some embodiments, the first sublayer and the first conductive layer may include a same material, the second sublayer and the second conductive layer may include a same material, and the third sublayer and the third conductive layer may include a same material.

According to some embodiments, the inorganic layer may extend to the display area to cover the source electrode and the drain electrode.

According to some embodiments, the display panel may further include an encapsulation layer covering the light emitting device and including at least one inorganic encapsulation layer, wherein the at least one inorganic encapsulation layer may extend from the display area to the intermediate area to continuously cover an upper surface of the inorganic layer, an inner surface of the inorganic layer, an inner surface of the metal layer, and a bottom surface of the groove.

According to some embodiments, the display panel may further include a partition wall located in the intermediate area, wherein the groove may be at least one of between the partition wall and the display area and between the partition wall and the transmission area.

According to one or more embodiments, a method of manufacturing a display panel includes forming, in an intermediate area surrounding a transmission area of a substrate, a groove including a first opening of a metal layer including a first sublayer, a second sublayer, and a third sublayer sequentially stacked, and a second opening of an inorganic layer covering the metal layer, and forming a light emitting device in a display area surrounding the intermediate area, wherein the forming of the groove includes forming, in the intermediate area, the metal layer including the first opening including a first sub-opening of the first sublayer, a second sub-opening of the second sublayer, and a third sub-opening of the third sublayer, forming, over the metal layer, the inorganic layer including the second opening exposing a portion of the third sublayer, etching the third sublayer exposed by the second opening, and etching the second sublayer such that an inner surface of the second sublayer includes a concave portion recessed in a direction farther away from a center of the first opening than an inner surface of the first sublayer and an inner surface of the third sublayer.

According to some embodiments, the forming of the light emitting device may include forming, in the display area, a first electrode, a second electrode, and an intermediate layer between the first electrode and the second electrode, wherein at least one common layer included in the intermediate layer may be disconnected by the groove.

According to some embodiments, the etching of the second sublayer may include etching the second sublayer simultaneously (or concurrently) with the first electrode in the forming of the first electrode.

According to some embodiments, an edge of an upper surface of the second sublayer in a center direction of the second sub-opening may match an edge of a lower surface of the third sublayer in a center direction of the third sub-opening, and an edge of a lower surface of the second sublayer in a center direction of the second sub-opening may match an edge of an upper surface of the first sublayer in a center direction of the first sub-opening.

According to some embodiments, a width of the third sub-opening may be greater than a width of the first sub-opening.

According to some embodiments, the etching of the third sublayer may include etching the third sublayer such that an edge of an upper surface of the third sublayer in a center direction of the third sub-opening matches an edge of a lower surface of the inorganic layer in a center direction of the second opening.

According to some embodiments, the forming of the light emitting device may include forming the light emitting device over a thin film transistor formed in the display area, wherein each of a source electrode and a drain electrode of the thin film transistor may include a conductive layer, a second conductive layer, and a third conductive layer, which are sequentially stacked.

According to some embodiments, the source electrode and the drain electrode may be formed simultaneously (or concurrently) with the metal layer in the forming of the metal layer, the first sublayer and the first conductive layer may include a same material, the second sublayer and the second conductive layer may include a same material, and the third sublayer and the third conductive layer may include a same material.

According to some embodiments, the inorganic layer may extend to the display area to cover the source electrode and the drain electrode.

According to some embodiments, the method may further include forming an encapsulation layer covering the light emitting device and including at least one inorganic encapsulation layer, wherein the at least one inorganic encapsulation layer may extend from the display area to the intermediate area to continuously cover an upper surface of the inorganic layer, an inner surface of the inorganic layer, an inner surface of the metal layer, and a bottom surface of the groove.

Other aspects, features, and characteristics other than those described above will become more apparent from the following detailed description, the appended claims, and the accompanying drawings.

Also, these general and particular aspects may be implemented by using systems, methods, computer programs, or any and all combinations of systems, methods, and computer programs.

BRIEF DESCRIPTION OF THE DRAWINGS

The above and other aspects, features, and characteristics of certain embodiments will be more apparent from the following description taken in conjunction with the accompanying drawings, in which.

DETAILED DESCRIPTION

Figure 1:
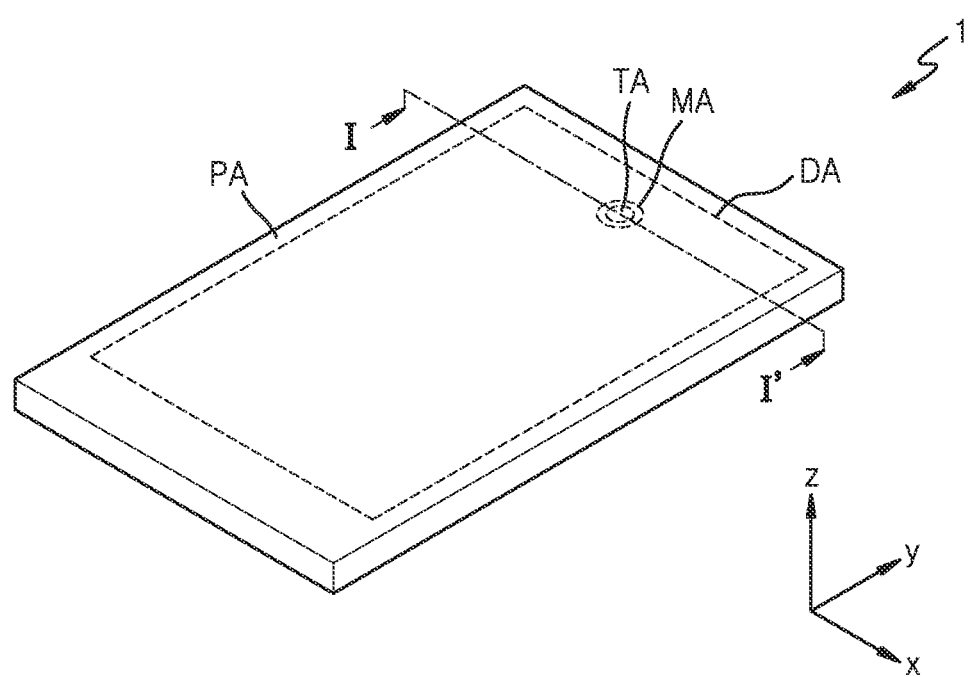
FIG. 1 is a perspective view schematically illustrating a portion of a display apparatus according to some embodiments.

Reference will now be made in more detail to aspects of some embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b and c" indicates only a, only b, only c, both a and b, both a and c, both b and c, all of a, b, and c, or variations thereof.

The disclosure may include various embodiments and modifications, and certain embodiments thereof are illustrated in the drawings and will be described herein in detail. The effects and features of the disclosure and the accomplishing methods thereof will become apparent from the embodiments described below in detail with reference to the accompanying drawings. However, embodiments according to the present disclosure are not limited to the embodiments described below and may be embodied in various modes.

It will be understood that although terms such as "first" and "second" may be used herein to describe various elements, these elements should not be limited by these terms and these terms are only used to distinguish one element from another element.

As used herein, the singular forms "a," "an," and "the" are intended to include the plural forms as well, unless the context clearly indicates otherwise.

It will be understood that terms such as "comprise," "include," and "have" used herein specify the presence of stated features or components, but do not preclude the presence or addition of one or more other features or components.

It will be understood that when a layer, region, or element is referred to as being "on" another layer, region, or element, it may be "directly on" the other layer, region, or element or may be "indirectly on" the other layer, region, or element with one or more intervening layers, regions, or elements therebetween.

Sizes of elements in the drawings may be exaggerated for convenience of description. In other words, because the sizes and thicknesses of elements in the drawings are arbitrarily illustrated for convenience of description, embodiments according to the present disclosure are not limited thereto.

When a certain embodiment may be implemented differently, a particular process order may be performed differently from the described order. For example, two consecutively described processes may be performed substantially at the same time or may be performed in an order opposite to the described order.

As used herein, "A and/or B" represents the case of A, B, or A and B. Also, "at least one of A and B" represents the case of A, B, or A and B.

It will be understood that when a layer, region, or component is referred to as being "connected to" another layer, region, or component, it may be "directly connected to" the other layer, region, or component or may be "indirectly connected to" the other layer, region, or component with one or more intervening layers, regions, or components therebetween. For example, it will be understood that when a layer, region, or component is referred to as being "electrically connected to" another layer, region, or component, it may be "directly electrically connected to" the other layer, region, or component and/or may be "indirectly electrically connected to" the other layer, region, or component with one or more intervening layers, regions, or components therebetween.

The x direction, the y direction, and the z direction are not limited to three axes of the rectangular coordinate system and may be interpreted in a broader sense. For example, the x direction, the y direction, and the z direction may be perpendicular to one another or may represent different directions that are not perpendicular to one another. Herein, a center direction of an opening may refer to an extension direction of a straight line passing through a center of the opening in a plane where the opening is located.

Hereinafter, aspects of some embodiments will be described in more detail with reference to the accompanying drawings, and in the following description, like reference numerals will denote like elements and redundant descriptions thereof will be omitted for conciseness.

FIG. 1 is a perspective view schematically illustrating a portion of a display apparatus according to some embodiments.

As illustrated in FIG. 1, a display apparatus 1 according to some embodiments may include a transmission area TA (or a first area) and a display area DA (or a second area) surrounding the transmission area TA. A plurality of pixels may be arranged in the display area DA, and the display area DA may display images through the pixels. The transmission area TA may be entirely surrounded by the display area DA.

An intermediate area MA (or a third area) may be provided between the transmission area TA and the display area DA. The intermediate area MA may be a non-display area where pixels are not arranged, and lines may be arranged to bypass the transmission area TA. Like the intermediate area MA, a peripheral area PA (or a fourth area) surrounding the display area DA may be a non-display area where pixels are not arranged, and various types of lines, internal circuits, and the like may be arranged in the peripheral area PA.

FIG. 1 illustrates that the transmission area TA is arranged at a center portion of the display area DA in the widthwise direction (e.g., the x direction) of the display apparatus 1; however, in other embodiments, the transmission area TA may be arranged to be offset to the left side or the right side in the widthwise direction of the display apparatus 1. Also, the transmission area TA may be arranged at various other positions such as at the upper side, at the center, or at the lower side in the lengthwise direction (e.g., the y direction) of the display apparatus 1. Additionally, according to some embodiments, the display area DA may include a plurality of transmission areas TA (with an intermediate area MA between the transmission areas TA and the display area DA).

Also, although FIG. 1 illustrates a case where the display apparatus 1 includes one transmission area TA, the display apparatus 1 may include a plurality of transmission areas TA in other embodiments.

Figure 2:
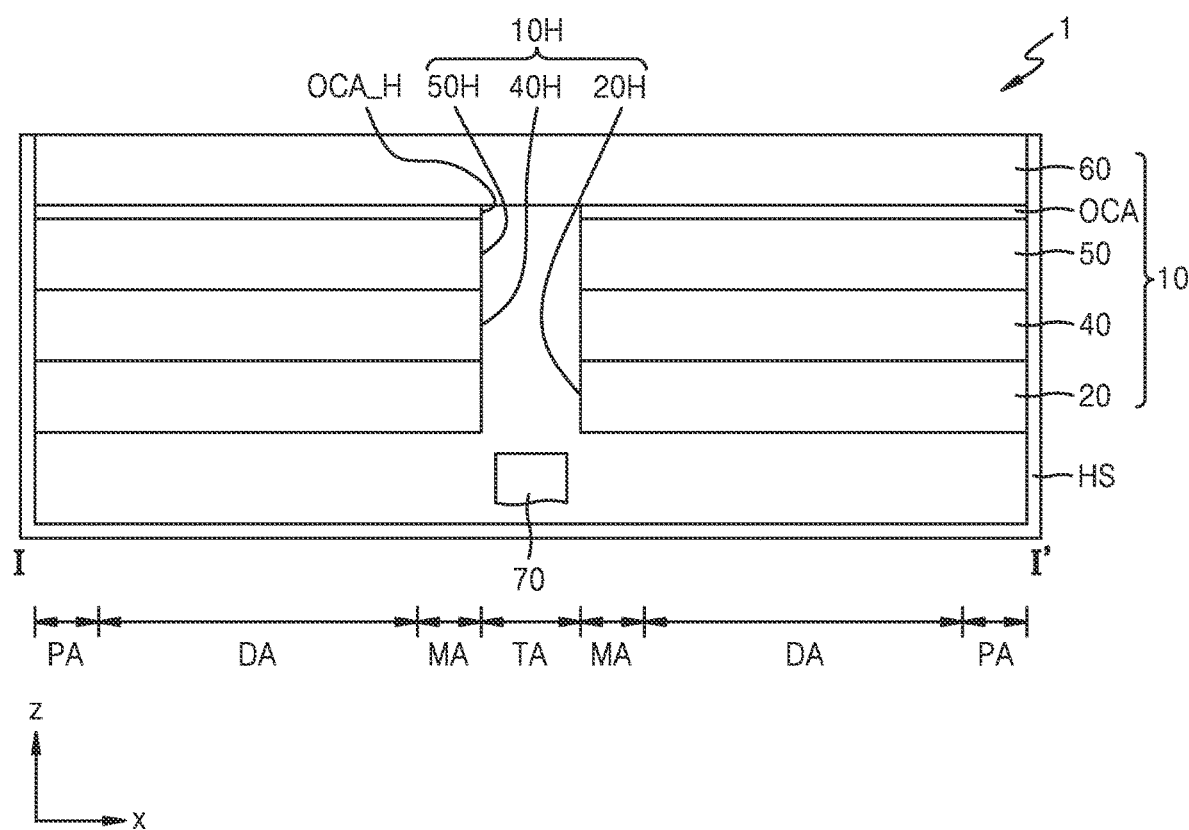
FIG. 2 is a cross-sectional view schematically illustrating a portion of the display apparatus of FIG. 1.

FIG. 2 is a cross-sectional view schematically illustrating a portion of the display apparatus of FIG. 1. FIG. 2 may correspond to a cross-sectional view of the display apparatus 1 taken along the line I-I' of FIG. 1.

As illustrated in FIG. 2, the display apparatus 1 according to some embodiments may include a display panel 10 and a component 70 arranged in the transmission area TA of the display panel 10. According to some embodiments, the display panel 10 and the component 70 may be accommodated in a housing HS. In other embodiments, the housing HS may be omitted.

The display panel 10 may include a display element layer 20, an input sensing layer 40, an optical functional layer 50, and a cover window 60.

The display element layer 20 may include light emitting devices that emit light to display images. According to some embodiments, the light emitting device may include an organic light emitting diode including an organic material. In other embodiments, the light emitting device may include an inorganic light emitting diode including an inorganic material. The inorganic light emitting diode may include a PN junction diode including inorganic semiconductor-based materials. In other embodiments, the light emitting device may include quantum dots as an emission layer. Hereinafter, for convenience of description, a case where the light emitting device includes an organic light emitting diode will be mainly described.

The input sensing layer 40 may be configured to acquire coordinate information according to an external input, for example, a touch event. The input sensing layer 40 may include a sensing electrode and signal lines (trace lines) connected to the sensing electrode. The input sensing layer 40 may be arranged over the display element layer 20. The input sensing layer 40 may be configured to sense an external input by a mutual capacitance method and/or a self-capacitance method but embodiments according to the present disclosure are not limited thereto.

The input sensing layer 40 may be directly formed on the display element layer 20 or may be separately formed and then coupled thereto through an adhesive layer such as an optical clear adhesive. For example, the input sensing layer 40 may be formed continuously after the process of forming the display element layer 20. In other embodiments, the adhesive layer between the input sensing layer 40 and the display element layer 20 may be omitted. FIG. 2 illustrates that the input sensing layer 40 is arranged between the display element layer 20 and the optical functional layer 50;

however, in other embodiments, the input sensing layer 40 may be arranged over the optical functional layer 50.

The optical functional layer 50 may include an anti-reflection layer. The anti-reflection layer may be configured to reduce the reflectance of light (external light) incident from the outside through the cover window 60 toward the display panel 10. The anti-reflection layer may include a phase retarder and a polarizer. In other embodiments, the anti-reflection layer may include a black matrix and color filters. The color filters may be arranged considering the color of light emitted from each of the light emitting devices of the display element layer 20.

In order to improve the transmittance of the transmission area TA, the display panel 10 may include a panel opening 10H penetrating some of the layers constituting the display panel 10. The panel opening 10H may include first to third openings 20H, 40H, and 50H respectively penetrating the display element layer 20, the input sensing layer 40, and the optical functional layer 50. The first opening 20H of the display element layer 20, the second opening 40H of the input sensing layer 40, and the third opening 50H of the optical functional layer 50 may overlap each other to form the panel opening 10H of the display panel 10.

The cover window 60 may be arranged over the optical functional layer 50. The cover window 60 may include a glass material or plastic. For example, the cover window 60 may include ultra-thin glass (UTG).

According to some embodiments, the cover window 60 may be coupled to the optical functional layer 50 through an adhesive layer such as an optical clear adhesive OCA therebetween. In other embodiments, this adhesive layer may be omitted. Moreover, the adhesive layer may be arranged to cover the entire surface of the cover window 60 but is not limited thereto. For example, as illustrated in FIG. 2, the adhesive layer may include an adhesive layer opening OCA_H overlapping the panel opening 10H.

The transmission area TA may be a type of component area (e.g., sensor area, camera area, or speaker area) in which the component 70 for adding various functions to the display apparatus 1 is located.

The component 70 may include an electronic element. For example, the component 70 may include an electronic element using light or sound. For example, the electronic element may include a sensor such as an infrared sensor using light, a camera for receiving light to acquire an image, a sensor for outputting and sensing light or sound to measure a distance or recognize a fingerprint or the like, a miniature lamp for outputting light, or a speaker for outputting sound. In the case of an electronic element using light, the electronic element may use light of various wavelength bands such as visible light, infrared light, and ultraviolet light. The transmission area TA may correspond to a transmission area through which light and/or sound output from the component 70 to the outside or propagating from the outside toward the electronic element may be transmitted.

Figure 3:
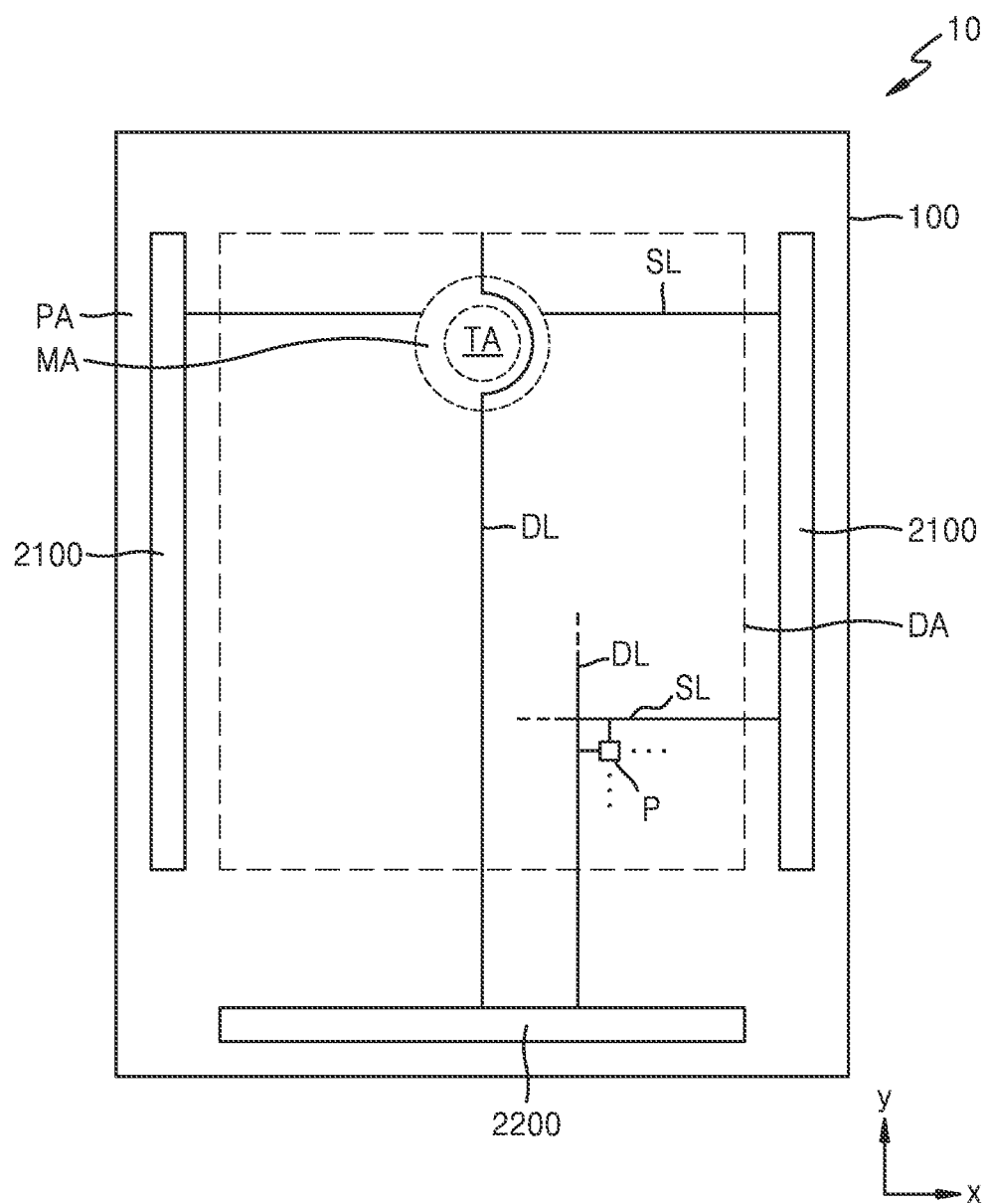
FIG. 3 is a plan view schematically illustrating a portion of a display panel according to some embodiments.

FIG. 3 is a plan view schematically illustrating a portion of a display panel according to some embodiments.

As illustrated in FIG. 3, the display panel 10 according to some embodiments may include a transmission area TA, a display area DA, an intermediate area MA, and a peripheral area PA.

The display panel 10 may include a plurality of pixels P arranged in the display area DA, and the display panel 10 may display an image by using light emitted from each pixel P. According to some embodiments, each pixel P may include a light emitting device to emit red, green, or blue light. The light emitting device of each pixel P may be electrically connected to a scan line SL and a data line DL.

A scan driver 2100 for providing a scan signal to the pixels P, a data driver 2200 for providing a data signal to the pixels P, and a first main power line and a second main power line for respectively providing a first power voltage and a second power voltage may be arranged in the peripheral area PA. The scan driver 2100 may be arranged on each of both sides with the display area DA therebetween. In this case, the pixel P arranged on the left side of the transmission area TA may be connected to the scan driver 2100 arranged on the left side, and the pixel P arranged on the right side of the transmission area TA may be connected to the scan driver 2100 arranged on the right side.

The intermediate area MA may surround the transmission area TA (e.g., in a periphery of the transmission area TA or outside a footprint of the transmission area TA). The intermediate area MA may be an area in which a light emitting device emitting light is not arranged, and signal lines for providing signals to pixels P arranged around the transmission area TA may pass through the intermediate area MA. For example, data lines DL and/or scan lines SL may intersect the display area DA, and some portions of the data lines DL and/or the scan lines SL may bypass the intermediate area MA along the edge of the panel opening 10H (see FIG. 2) of the display panel 10 formed in the transmission area TA. According to some embodiments, FIG. 3 illustrates that the data lines DL intersect the display area DA in the y direction and some data lines DL bypass and partially surround the transmission area TA in the intermediate area MA. The scan lines SL may intersect the display area DA in the x direction and may be spaced apart from each other with the transmission area TA therebetween.

FIG. 3 illustrates that the data driver 2200 is arranged adjacent to one side of a substrate 100; however, in other embodiments, the data driver 2200 may be arranged on a printed circuit board electrically connected to a pad arranged at one side of the display panel 10. The printed circuit board may be flexible, and a portion of the flexible printed circuit board may be bent to be located under the rear surface of the substrate 100.

Figure 4:
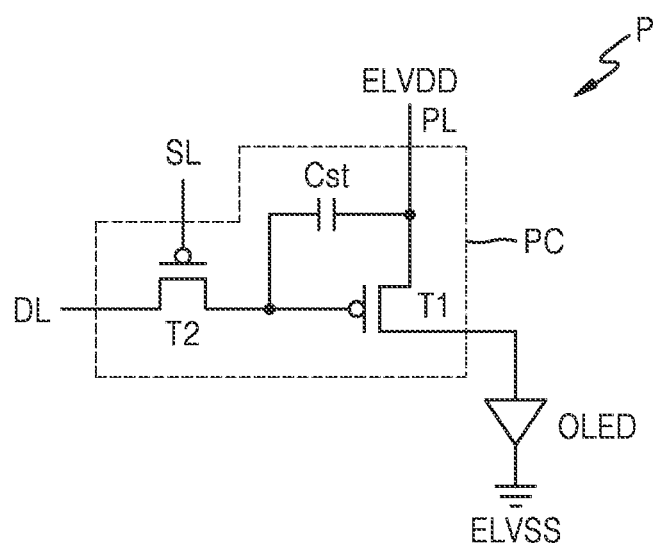
FIG. 4 is an equivalent circuit diagram of a pixel included in a display panel according to some embodiments.

FIG. 4 is an equivalent circuit diagram of a pixel included in a display panel according to some embodiments.

As illustrated in FIG. 4, the light emitting device of each pixel P may include an organic light emitting diode OLED, and each organic light emitting diode OLED may be electrically connected to a pixel circuit PC.

The pixel circuit PC may include a first thin film transistor T1, a second thin film transistor T2, and a storage capacitor Cst.

As a switching thin film transistor, the second thin film transistor T2 may be connected to a scan line SL and a data line DL and may be configured to transmit a data voltage input from the data line DL to the first thin film transistor T1 according to a switching voltage input from the scan line SL. The storage capacitor Cst may be connected to the second thin film transistor T2 and a driving voltage line PL and may be configured to store a voltage corresponding to the difference between a voltage received from the second thin film transistor T2 and a first power voltage ELVDD supplied to the driving voltage line PL.

As a driving thin film transistor, the first thin film transistor T1 may be connected to the driving voltage line PL and the storage capacitor Cst and may be configured to control a driving current flowing from the driving voltage line PL through the organic light emitting diode OLED in response to a value of voltage stored in the storage capacitor Cst. The organic light emitting diode OLED may emit light with a certain brightness according to the driving current. A second electrode (e.g., a cathode) of the organic light emitting diode OLED may be supplied with a second power voltage ELVSS.

Although FIG. 4 illustrates that the pixel circuit PC includes two thin film transistors T1 and T2 and one storage capacitor Cst, embodiments according to the present disclosure are not limited thereto. The number of thin film transistors and the number of storage capacitors may be variously modified according to the design of the pixel circuit PC. For example, the pixel circuit PC may further include four or more thin film transistors in addition to the two thin film transistors T1 and T2 described above. Also, the pixel circuit PC may further include one or more capacitors in addition to the storage capacitor Cst described above.

Figure 5:
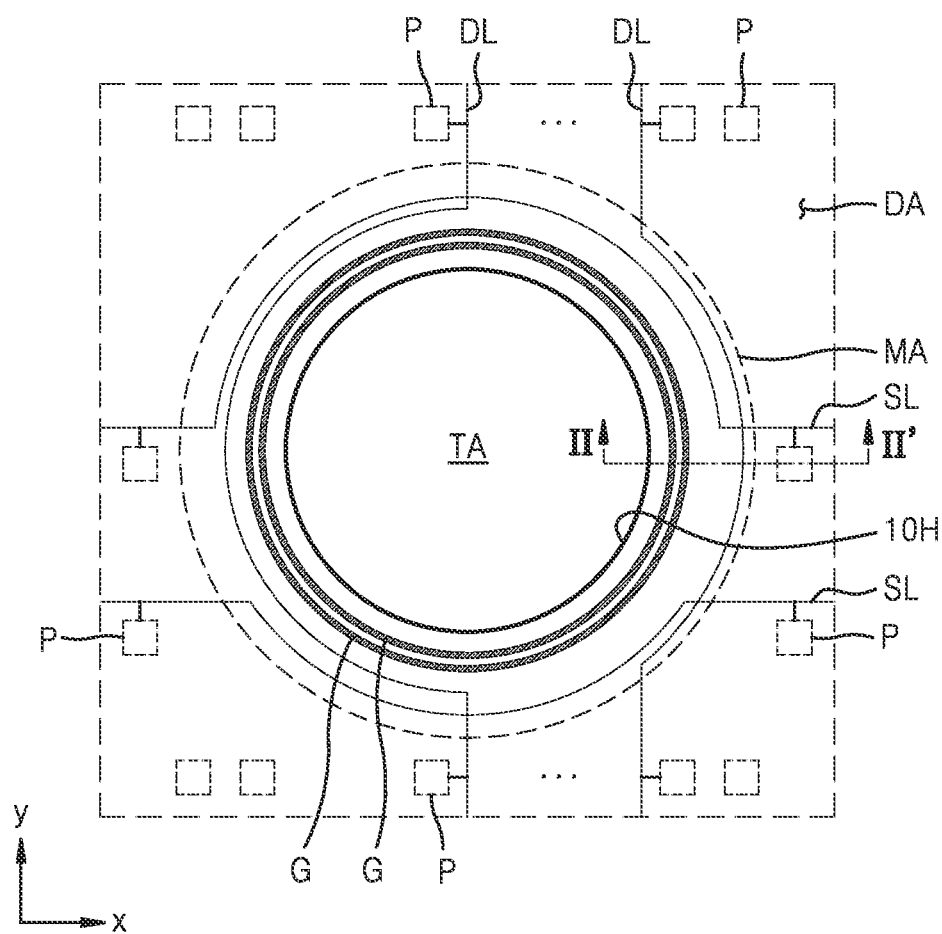
FIG. 5 is a plan view schematically illustrating a portion of a display panel according to some embodiments.

FIG. 5 is a plan view schematically illustrating a portion of a display panel according to some embodiments.

As illustrated in FIG. 5, the display panel 10 (see FIG. 2) according to some embodiments may include a display area DA, a transmission area TA, and an intermediate area MA between the display area DA and the transmission area TA.

Referring to FIG. 5, pixels P may be arranged in the display area DA, and the intermediate area MA may be located between the transmission area TA and the display area DA. The pixels P adjacent to the transmission area TA may be arranged apart from each other around the transmission area TA in the plan view. As illustrated in the plan view of FIG. 5, the pixels P may be arranged vertically apart from each other around the transmission area TA or may be arranged horizontally apart from each other around the transmission area TA. As described above, each pixel P may include a light emitting device emitting red, green, or blue light, and the positions of the pixels P illustrated in FIG. 5 may respectively correspond to the positions of the light emitting devices. Thus, the fact that the pixels P are arranged apart from each other around the transmission area TA in the plan view may represent that the light emitting devices are arranged apart from each other around the transmission area TA in the plan view. For example, in the plan view, the light emitting devices may be arranged vertically apart from each other around the transmission area TA or may be arranged horizontally apart from each other around the transmission area TA.

Among the signal lines configured to supply signals to the pixel circuit (PC, see FIG. 4) connected to the light emitting device of each pixel P, signal lines adjacent to the transmission area TA may bypass the transmission area TA. Among the data lines passing through the display area DA, some data lines DL may extend in the ±y direction to provide data signals to the pixels P respectively arranged over and under the transmission area TA and may bypass along the edge of the panel opening 10H and/or the transmission area TA in the intermediate area MA. Among the scan lines passing through the display area DA, some scan lines SL may extend in the ±x direction to provide scan signals to the pixels P respectively arranged on the left and right sides with the transmission area TA therebetween and may bypass along the edge of the panel opening 10H and/or the transmission area TA in the intermediate area MA.

In this regard, although FIG. 5 illustrates that the scan line SL bypasses the transmission area TA in the intermediate area MA, embodiments according to the present disclosure are not limited thereto. In other embodiments, the scan line SL may be separated or disconnected around the transmission area TA, the scan line SL arranged on the left side around the transmission area TA may receive a signal from the scan driver 2100 (see FIG. 3) arranged on the left side around the display area DA, and the scan line SL arranged on the right side around the transmission area TA may receive a signal from an additional scan driver arranged opposite the scan driver 2100 around the display area DA.

At least one groove G may be arranged in the intermediate area MA. The groove G may prevent or reduce instances of the light emitting device being damaged due to the inflow of moisture through the transmission area TA. For example, the groove G may prevent or reduce the penetration of moisture into the display area DA by disconnecting (or separating) a layer that may become a movement path of moisture among the layers formed over the substrate 100 (see FIG. 3). For example, the groove G may disconnect (or separate) a second electrode 223 (see FIG. 6) and/or at least some of the common layers included in an intermediate layer 222 (see FIG. 6) described below.

The groove G may be arranged to entirely surround the transmission area TA in the plan view. For example, the groove G may be arranged in a ring shape in the intermediate area MA. Also, when a plurality of grooves G are arranged, the grooves G may be spaced apart from each other. Although FIG. 5 illustrates a case where two grooves G are arranged, embodiments according to the present disclosure are not limited thereto and the display apparatus may include one groove G or may include three or more grooves G.

Figure 6:
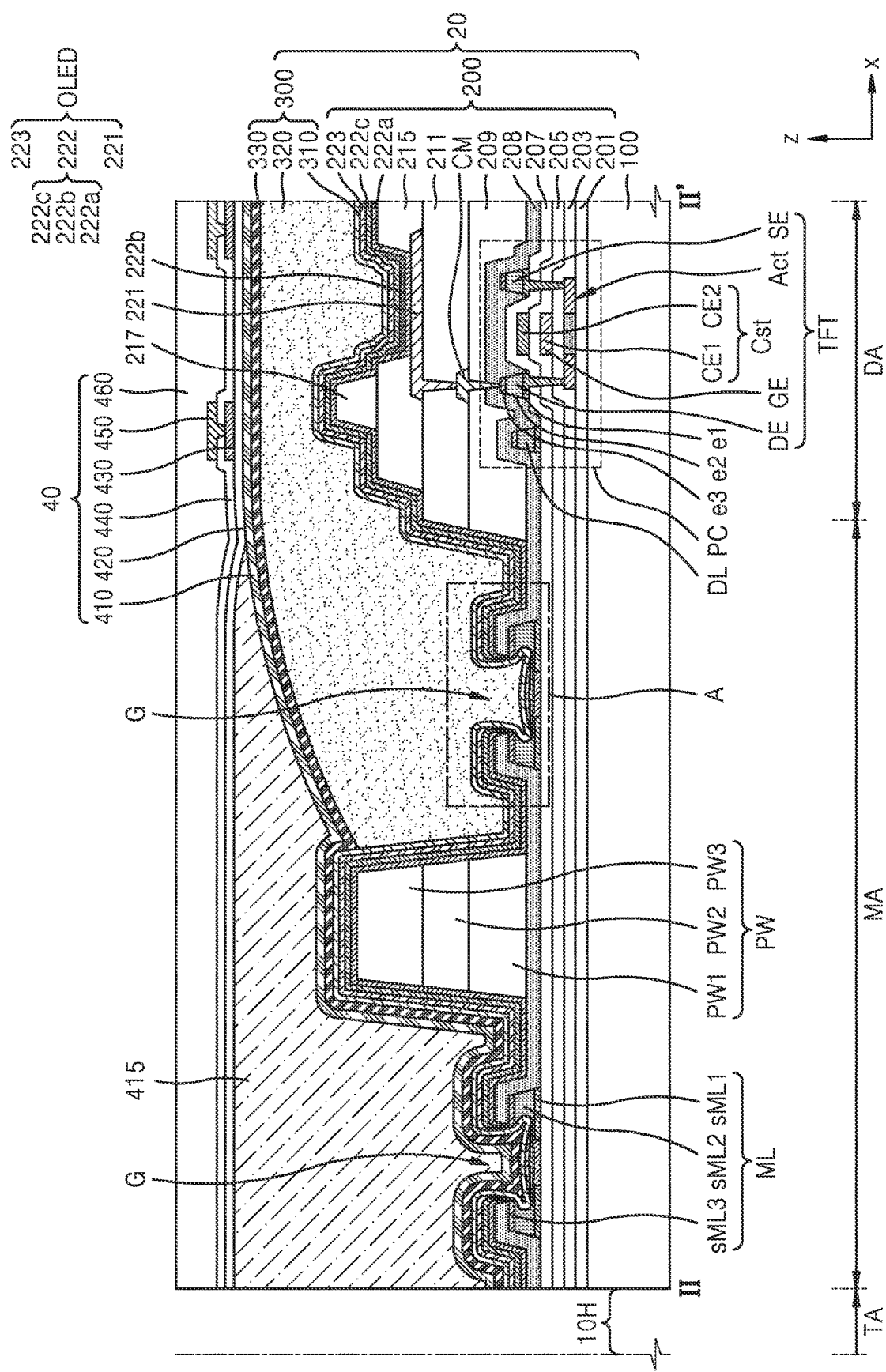
FIG. 6 is a cross-sectional view schematically illustrating a portion of a display panel according to some embodiments.

FIG. 6 is a cross-sectional view schematically illustrating a portion of a display panel according to some embodiments. FIG. 6 may correspond to a cross-sectional view of the display panel 10 (see FIG. 2) taken along the line II-II' of FIG. 5.

As illustrated in FIG. 6, the display panel 10 (see FIG. 2) according to some embodiments may include a display element layer 20 and an input sensing layer 40 located over the display element layer 20. Moreover, according to some embodiments, the optical functional layer 50 and/or the cover window 60 described above with reference to FIG. 2 may be further arranged over the input sensing layer 40. The display element layer 20 of the display panel 10 may include a substrate 100, a display layer 200 located over the substrate 100, and an encapsulation layer 300 located over the display layer 200. The display panel 10 may include a panel opening 10H corresponding to the transmission area TA. The panel opening 10H may be formed to penetrate the substrate 100, the display layer 200, and the encapsulation layer 300.

The substrate 100 may include glass, metal, or polymer resin. When the substrate 100 is flexible or bendable, the substrate 100 may include, for example, a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. However, the substrate 100 may be variously modified such as including a multilayer structure including two layers including the polymer resin and a barrier layer arranged between the two layers and including an inorganic material (e.g., silicon oxide, silicon nitride, or silicon oxynitride).

A buffer layer 201 may be located over the substrate 100. The buffer layer 201 may function to increase the smoothness of the upper surface of the substrate 100 or to prevent, reduce, or minimize the penetration of impurities or moisture from the outside of the substrate 100 into the display layer 200. The buffer layer 201 may include an inorganic material such as silicon oxide, silicon nitride, and/or silicon oxynitride and may be formed as a single layer or a multilayer.

In the display area DA, a pixel circuit PC included in each of the pixels P (see FIG. 5) and a light emitting device, for example, an organic light emitting diode OLED, electrically connected to the pixel circuit PC may be arranged over the substrate 100.

The pixel circuit PC may include a thin film transistor TFT and a storage capacitor Cst. The thin film transistor TFT may include a semiconductor layer Act, a gate electrode GE, a source electrode SE, and a drain electrode DE.

The semiconductor layer Act may include a channel area and a source area and a drain area arranged on both sides of the channel area. The semiconductor layer Act may include polysilicon. Alternatively, the semiconductor layer Act may include amorphous silicon, may include an oxide semiconductor, or may include an organic semiconductor or the like.

The gate electrode GE may be arranged to overlap the channel area of the semiconductor layer Act. The gate electrode GE may include a conductive material including molybdenum (Mo), aluminum (Al), copper (Cu), titanium (Ti), or the like and may include a single-layer or multilayer structure including the above material. For example, the gate electrode GE may include a Mo layer and/or an Al layer or may have a three-layer structure of Mo layer/Al layer/Mo layer.

A gate insulating layer 203 may be arranged between the semiconductor layer Act and the gate electrode GE. The gate insulating layer 203 may include an inorganic insulating material such as silicon oxide, silicon nitride, or silicon oxynitride and may include a single-layer or multilayer structure including the above inorganic insulating material.

The source electrode SE and the drain electrode DE may be arranged over an insulating layer arranged over the gate electrode GE. According to some embodiments, the source electrode SE and the drain electrode DE may be arranged over a second interlayer insulating layer 207 covering an upper electrode CE2 of the storage capacitor Cst. The source electrode SE and the drain electrode DE may be connected to the source area or the drain area of the semiconductor layer Act through a contact hole. The source electrode SE and the drain electrode DE may include various conductive materials including molybdenum (Mo), aluminum (Al), copper (Cu), titanium (Ti), or the like and may have various layer structures. For example, the source electrode SE and the drain electrode DE may include a Ti layer and/or an Al layer or may have a three-layer structure of Ti layer/Al layer/Ti layer. Particularly, each of the source electrode SE and the drain electrode DE may include a first conductive layer e1, a second conductive layer e2, and a third conductive layer e3 that are sequentially stacked. Here, the first conductive layer e1 may include titanium (Ti), the second conductive layer e2 may include aluminum (Al), and the third conductive layer e3 may include titanium (Ti).

Moreover, referring to FIG. 6, the data line DL may be arranged over the same layer as the source electrode SE and the drain electrode DE and may include the same material as the source electrode SE and the drain electrode DE. In other embodiments, unlike in FIG. 6, the data line DL may be arranged over the same layer as a contact metal layer CM and may include the same material as the contact metal layer CM.

The source electrode SE, the drain electrode DE, and/or the data line DL may be covered by an inorganic layer 208. The inorganic layer 208 may extend from the display area DA to the intermediate area MA. The inorganic layer 208 may include an opening constituting a portion of the groove G arranged in the intermediate area MA. The inorganic layer 208 may include an inorganic insulating material such as silicon oxide, silicon nitride, or silicon oxynitride and may include a single-layer or multilayer structure including the above inorganic insulating material.

The storage capacitor Cst may include a lower electrode CE1 and an upper electrode CE2 overlapping each other with a first interlayer insulating layer 205 therebetween. The storage capacitor Cst may overlap the thin film transistor TFT. In this regard, FIG. 6 illustrates that the gate electrode GE of the thin film transistor TFT is the lower electrode CE1 of the storage capacitor Cst. In other embodiments, the storage capacitor Cst may not overlap the thin film transistor TFT. The storage capacitor Cst may be covered by a second interlayer insulating layer 207. The upper electrode CE2 of the storage capacitor Cst may include a conductive material including molybdenum (Mo), aluminum (Al), copper (Cu), titanium (Ti), or the like and may include a single layer or multiple layers including the above material.

The first interlayer insulating layer 205 and/or the second interlayer insulating layer 207 may include an inorganic insulating material such as silicon oxide, silicon nitride, silicon oxynitride, aluminum oxide, titanium oxide, tantalum oxide, or hafnium oxide. The first interlayer insulating layer 205 and the second interlayer insulating layer 207 may include a single-layer or multilayer structure including the above material.

The pixel circuit PC including the thin film transistor TFT and the storage capacitor Cst may be covered by a first organic insulating layer 209. The first organic insulating layer 209 may include a substantially flat upper surface.

The pixel circuit PC may be electrically connected to a first electrode 221 (e.g., an anode). For example, as illustrated in FIG. 6, a contact metal layer CM may be arranged between the thin film transistor TFT and the first electrode 221. The contact metal layer CM may be connected to the thin film transistor TFT through a contact hole formed in the first organic insulating layer 209 and the inorganic layer 208, and the first electrode 221 may be connected to the contact metal layer CM through a contact hole formed in a second organic insulating layer 211 over the contact metal layer CM. The contact metal layer CM may include a conductive material including molybdenum (Mo), aluminum (Al), copper (Cu), titanium (Ti), or the like and may include a single layer or multiple layers including the above material.

The first organic insulating layer 209 and/or the second organic insulating layer 211 may include an organic insulating material such as a general-purpose polymer such as polystyrene (PS) or polymethylmethacrylate (PMMA), a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, or any blend thereof. According to some embodiments, the first organic insulating layer 209 and/or the second organic insulating layer 211 may include polyimide.

The first electrode 221 may be formed over the second organic insulating layer 211. The first electrode 221 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). Also, the first electrode 221 may include a reflection layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. According to some embodiments, the first electrode 221 may include a three-layer structure of ITO layer/Ag layer/ITO layer sequentially stacked.

A pixel definition layer 215 may be formed over the first electrode 221. The pixel definition layer 215 may include an opening exposing the upper surface of the first electrode 221 and may cover the edge of the first electrode 221. The pixel definition layer 215 may include an organic insulating material. Alternatively, the pixel definition layer 215 may include an inorganic insulating material such as silicon nitride, silicon oxynitride, or silicon oxide. Alternatively, the pixel definition layer 215 may include an organic insulating material and an inorganic insulating material.

An intermediate layer 222 may include an emission layer 222b. The intermediate layer 222 may include a first common layer 222a arranged under the emission layer 222b and/or a second common layer 222c arranged over the emission layer 222b. The emission layer 222b may include a high-molecular or low-molecular weight organic material for emitting light of a certain color.

The first common layer 222a may include a single layer or multiple layers. For example, when the first common layer 222a is formed of a high-molecular weight material, the first common layer 222a may include a hole transport layer (HTL) having a single-layer structure and may be formed of poly-(3,4)-ethylene-dihydroxy thiophene (PEDOT) or polyaniline (PANI). When the first common layer 222a is formed of a low-molecular weight material, the first common layer 222a may include a hole injection layer (HIL) and/or an HTL.

The second common layer 222c may be optional. For example, when the first common layer 222a and the emission layer 222b are formed of a high-molecular weight material, the second common layer 222c may be formed. The second common layer 222c may include a single layer or multiple layers. The second common layer 222c may include an electron transport layer (ETL) and/or an electron injection layer (EIL).

The emission layer 222b of the intermediate layer 222 may be arranged for each pixel P (see FIG. 5) in the display area DA. The emission layer 222b may be patterned to correspond to the first electrode 221. Unlike the emission layer 222b, the first common layer 222a and/or the second common layer 222c of the intermediate layer 222 may be located not only in the display area DA but also in the intermediate area MA and may be integrally formed over the substrate 100.

A second electrode 223 (e.g., a cathode) may include a conductive material having a low work function. For example, the second electrode 223 may include a (semi) transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the second electrode 223 may further include a layer such as ITO, IZO, ZnO, or $In_2O_3$ over the (semi)transparent layer including the above material. The second electrode 223 may be integrally formed over the intermediate area MA as well as over the display area DA. The first common layer 222a, the second common layer 222c, and the second electrode 223 may be formed by thermal deposition.

According to some embodiments, a capping layer may be arranged over the second electrode 223. The capping layer may include lithium fluoride (LiF) and may be formed by thermal deposition.

The second electrode 223 and/or the common layers 222a and 222c included in the intermediate layer 222 may extend from the display area DA to the intermediate area MA. That is, the intermediate layer 222 and/or the second electrode 223 may be arranged over the entire surface of the display area DA and the intermediate area MA. At least some of the common layers 222a and 222c and the second electrode 223 may be disconnected (or separated) by the groove G arranged in the intermediate area MA. This will be described below in detail.

A spacer 217 may be formed over the pixel definition layer 215. The spacer 217 may include an organic insulating material such as polyimide. Alternatively, the spacer 217 may include an inorganic insulating material or may include an organic insulating material and an inorganic insulating material.

The spacer 217 may include a different material than the pixel definition layer 215 or may include the same material as the pixel definition layer 215. According to some embodiments, the pixel definition layer 215 and the spacer 217 may include polyimide. The pixel definition layer 215 and the spacer 217 may be formed together in a mask process using a halftone mask.

The organic light emitting diode OLED may be covered by an encapsulation layer 300. The encapsulation layer 300 may include at least one organic encapsulation layer and at least one inorganic encapsulation layer. According to some embodiments, FIG. 6 illustrates that the encapsulation layer 300 includes first and second inorganic encapsulation layers 310 and 330 and an organic encapsulation layer 320 arranged therebetween.

The first inorganic encapsulation layer 310 and the second inorganic encapsulation layer 330 may include one or more inorganic materials among aluminum oxide, titanium oxide, tantalum oxide, hafnium oxide, zinc oxide, silicon oxide, silicon nitride, and silicon oxynitride. The first inorganic encapsulation layer 310 and the second inorganic encapsulation layer 330 may include a single layer or multiple layers including the above material. The organic encapsulation layer 320 may include a polymer-based material. The polymer-based material may include acryl-based resin, epoxy-based resin, polyimide, polyethylene, or the like. According to some embodiments, the organic encapsulation layer 320 may include acrylate.

Referring to the intermediate area MA of FIG. 6, a partition wall PW may be located in the intermediate area MA. The partition wall PW may include a plurality of partition wall layers that are sequentially stacked. According to some embodiments, as illustrated in FIG. 6, the partition wall PW may include a first partition wall layer PW1, a second partition wall layer PW2, and a third partition wall layer PW3. The first partition wall layer PW1 may include the same material, may have the same layer structure, and may be formed together in the same process as the first organic insulating layer 209, the second partition wall layer PW2 may include the same material, may have the same layer structure, and may be formed together in the same process as the second organic insulating layer 211, and the third partition wall layer PW3 may include the same material, may have the same layer structure, and may be formed together in the same process as the pixel definition layer 215 and/or the spacer 217.

The partition wall PW may be arranged apart from the groove G. Also, like the groove G, the partition wall PW may entirely surround the transmission area TA in the plan view.

One or more grooves G may be arranged in the intermediate area MA. The groove G may be arranged in the intermediate area MA and may include a first opening OP1 (see FIG. 7) of a metal layer ML including a first sublayer sML1, a second sublayer sML2, and a third sublayer sML3 that are sequentially stacked and a second opening OP2 (see FIG. 7) of the inorganic layer 208 covering the metal layer ML. A detailed structure of the groove G will be described below in detail with reference to FIG. 7.

Moreover, although FIG. 6 illustrates a case where the metal layer ML is located over the second interlayer insulating layer 207, embodiments according to the present disclosure are not limited thereto. For example, the metal layer ML may be located over the substrate 100, may be located over the buffer layer 201, may be located over the gate insulating layer 203, or may be located over the first interlayer insulating layer 205.

According to some embodiments, in the intermediate area MA, the groove G may be arranged between the partition wall PW and the display area DA and/or between the partition wall PW and the transmission area TA. In this regard, although FIG. 6 illustrates that the groove G is arranged between the partition wall PW and the display area DA and between the partition wall PW and the transmission area TA, embodiments according to the present disclosure are not limited thereto. For example, the groove G may be arranged only between the partition wall PW and the display area DA or may be arranged only between the partition wall PW and the transmission area TA.

Also, there is no limitation on the number of grooves G arranged in the intermediate area MA. In this regard, although FIG. 6 illustrates that one groove G is arranged each of between the partition wall PW and the display area DA and between the partition wall PW and the transmission area TA, embodiments according to the present disclosure are not limited thereto. For example, two or more grooves G may be arranged between the partition wall PW and the display area DA and/or between the partition wall PW and the transmission area TA.

At least some of the common layers included in the intermediate layer 222 and the second electrode 223 may be disconnected (or separated) by the groove G arranged in the intermediate area MA. For example, the first common layer 222a, the second common layer 222c, and/or the second electrode 223 may be disconnected by the groove G.

The encapsulation layer 300 may also be located in the intermediate area MA. The first and second inorganic encapsulation layers 310 and 330 may have a better step coverage than the first common layer 222a, the second common layer 222c, the second electrode 223, and/or the capping layer described above. The first and second inorganic encapsulation layers 310 and 330 may be continuously formed as illustrated in FIG. 6. For example, the first and second inorganic encapsulation layers 310 and 330 may continuously and entirely cover the inner surface and/or the bottom surface of the groove G along the shape of the groove G. The first and second inorganic encapsulation layers 310 and 330 may be formed by chemical vapor deposition.

The input sensing layer 40 may be located over the display element layer 20.

The input sensing layer 40 may include a first insulating layer 410, a second insulating layer 420, a third insulating layer 440, and a fourth insulating layer 460 that are sequentially stacked. Also, the input sensing layer 40 may include a first conductive layer 430 between the second insulating layer 420 and the third insulating layer 440 and a second conductive layer 450 between the third insulating layer 440 and the fourth insulating layer 460. The first conductive layer 430 and/or the second conductive layer 450 may include touch electrodes for sensing a touch input and trace lines connected to the touch electrodes.

The first insulating layer 410, the second insulating layer 420, the third insulating layer 440, and the fourth insulating layer 460 may be integrally formed to be located in the display area DA and the intermediate area MA. The first insulating layer 410, the second insulating layer 420, and the third insulating layer 440 may include an inorganic insulating material such as silicon oxide, silicon nitride, or silicon oxynitride, and the fourth insulating layer 460 may include an organic insulating material. For example, the organic insulating material of the fourth insulating layer 460 may include a photoresist (negative or positive) or may include a polymer-based organic material or the like.

The first conductive layer 430 and/or the second conductive layer 450 may include a metal or a transparent conductive oxide (TCO). In some embodiments, the first conductive layer 430 and/or the second conductive layer 450 may include a conductive material including molybdenum (Mo), aluminum (Al), copper (Cu), titanium (Ti), or the like.

A planarization layer 415 may include an organic insulating layer. The planarization layer 415 may include a polymer-based material. For example, the planarization layer 415 may include silicon-based resin, acryl-based resin, epoxy-based resin, polyimide, and/or polyethylene. The planarization layer 415 may include a different material than the organic encapsulation layer 320.

The organic encapsulation layer 320 may be located on one side of the partition wall PW, and an area of the intermediate area MA that is not covered by the organic encapsulation layer 320 may be covered by the planarization layer 415. A portion of the organic encapsulation layer 320 may overlap the planarization layer 415. Because the planarization layer 415 is located in an area not covered by the organic encapsulation layer 320 in the intermediate area MA, the flatness of the display panel 10 (see FIG. 2) around the panel opening 10H may be increased. Accordingly, problems such as delamination of the input sensing layer 40 and/or the optical functional layer 50 (see FIG. 2) over the display panel 10 may be prevented or reduced.

The planarization layer 415 may be arranged between any two insulating layers among the second inorganic encapsulation layer 330, the first insulating layer 410, the second insulating layer 420, the third insulating layer 440, and the fourth insulating layer 460 in the intermediate area MA. According to some embodiments, as illustrated in FIG. 6, the planarization layer 415 may be arranged between the first insulating layer 410 and the second insulating layer 420 in the intermediate area MA. In this case, the second inorganic encapsulation layer 330 and the first insulating layer 410 may be arranged between the organic encapsulation layer 320 and the planarization layer 415 overlapping each other. In other embodiments, the planarization layer 415 may be arranged between the third insulating layer 440 and the fourth insulating layer 460 in the intermediate area MA. In this case, the first to third insulating layers 410, 420, and 440 may cover the upper surface of the encapsulation layer 300 covering the grooves G.

Figure 7:
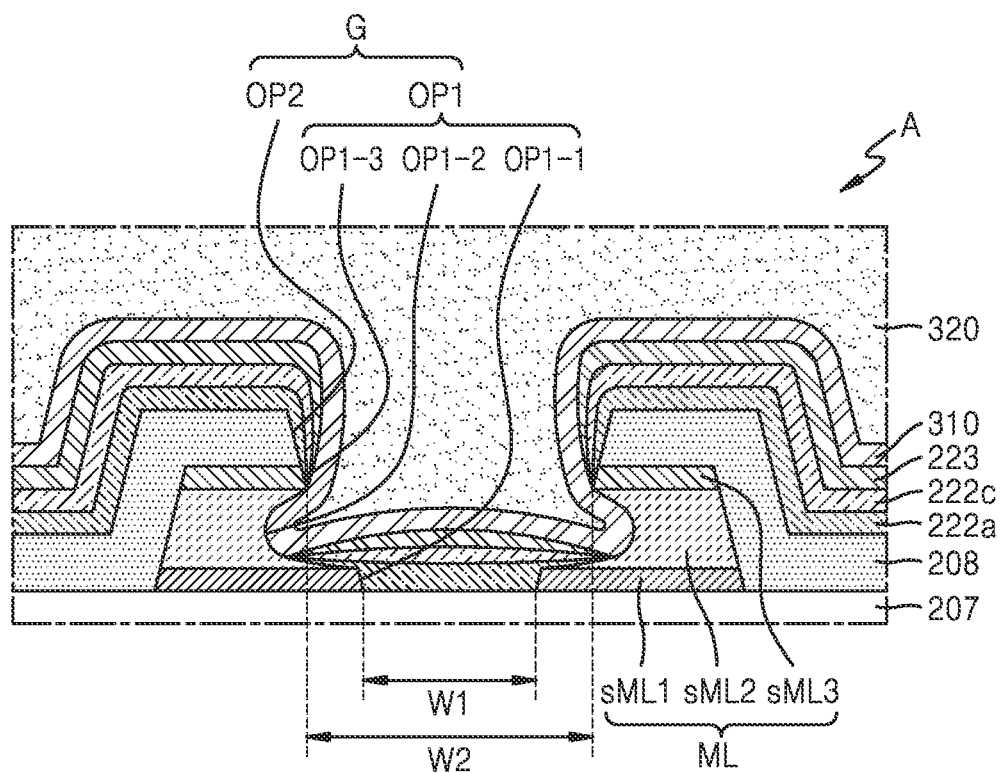
FIG. 7 is an enlarged cross-sectional view schematically illustrating a groove included in a display panel according to some embodiments.

FIG. 7 is an enlarged cross-sectional view schematically illustrating a groove included in a display panel according to some embodiments. FIG. 7 may correspond to an enlarged cross-sectional view illustrating region A of FIG. 6.

As illustrated in FIG. 7, the groove G included in the display panel 10 (see FIG. 2) according to some embodiments may include a first opening OP1 of the metal layer ML and a second opening OP2 of the inorganic layer 208 covering the metal layer ML.

The metal layer ML may have a three-layer structure in which a first sublayer sML1, a second sublayer sML2, and a third sublayer sML3 are sequentially stacked. Also, each of the first sublayer sML1, the second sublayer sML2, and the third sublayer sML3 may include an opening forming the first opening OP1 of the metal layer ML. Particularly, the first sublayer sML1 may include a first sub-opening OP1-1, the second sublayer sML2 may include a second sub-opening OP1-2 overlapping the first sub-opening OP1-1, and the third sublayer sML3 may include a third sub-opening OP1-3 overlapping the first sub-opening OP1-1 and the second sub-opening OP1-2. That is, the first opening OP1 of the metal layer ML may include the first sub-opening OP1-1 of the first sublayer sML1, the second sub-opening OP1-2 of the second sublayer sML2, and the third sub-opening OP1-3 of the third sublayer sML3 that overlap each other.

According to some embodiments, the metal layer ML may have the same layer structure, may include the same material, and may be formed together in the same process as the source electrode SE (see FIG. 6) and drain electrode DE (see FIG. 6) described above. Particularly, the metal layer ML may include a first sublayer sML1, a second sublayer sML2, and a third sublayer sML3 that are sequentially stacked, and the source electrode SE and the drain electrode DE may include a first conductive layer e1, a second conductive layer e2, and a third conductive layer e3. For example, the first sublayer sML1 and the first conductive layer e1 include titanium (Ti), the second sublayer sML2 and the second conductive layer e2 include aluminum (Al), and the third sublayer sML3 and the third conductive layer e3 may include titanium (Ti).

Each of the grooves G may have a shape capable of disconnecting the second electrode 223 covering the groove G and/or the common layers 222a and 222c included in the intermediate layer 222 covering the groove G. Particularly, the metal layer ML in which the first opening OP1 of the groove G is formed may include a concave portion (or an undercut structure) on the inner surface of the first opening OP1, and the inorganic layer 208 in which the second opening OP2 of the groove G is formed may include a pair of tips arranged on both sides of the groove G. The second electrode 223 covering the groove G and/or the common layers 222a and 222c included in the intermediate layer 222 covering the groove G may be disconnected by the concave portion (or undercut structure) of the metal layer ML or the tip of the inorganic layer 208.

The concave portion (or undercut structure) of the metal layer ML may be formed in the second sublayer sML2. The inner surface of the second sublayer sML2 in the center direction of the second sub-opening OP1-2 may include a concave portion recessed in a direction farther away from the center of the first opening OP1 than the inner surface of the first sublayer sML1 in the center direction of the first sub-opening OP1-1 and the inner surface of the third sublayer sML3 in the center direction of the third sub-opening OP1-3. That is, in the view in a direction perpendicular to the substrate 100 (see FIG. 6), the area of the second sub-opening OP1-2 may increase from the upper surface of the second sublayer sML2 toward the center of the second sublayer sML2 and may decrease from the center of the second sublayer sML2 toward the lower surface of the second sublayer sML2.

According to some embodiments, the edge of the upper surface of the second sublayer sML2 in the center direction of the second sub-opening OP1-2 may match the edge of the lower surface of the third sublayer sML3 in the center direction of the third sub-opening OP1-3. Also, the edge of the lower surface of the second sublayer sML2 in the center direction of the second sub-opening OP1-2 may match the edge of the upper surface of the first sublayer sML1 in the center direction of the first sub-opening OP1-1.

Also, in the view in a direction perpendicular to the substrate 100 (see FIG. 6), the area of the third sub-opening OP1-3 of the third sublayer sML3 may be greater than the area of the first sub-opening OP1-1 of the first sublayer sML1. That is, a width W2 of the third sub-opening OP1-3 may be greater than a width W1 of the first sub-opening OP1-1 of the first sublayer sML1. Here, "the width of the opening" may refer to the distance between the inner edges of the lower surface of the layer in which the opening is formed.

According to some embodiments, the edge of the upper surface of the third sublayer sML3 in the center direction of the third sub-opening OP1-3 may match the edge of the inorganic layer 208 in the center direction of the second opening OP2. Also, the inner surface of the third sublayer sML3 in the center direction of the third sub-opening OP1-3 may not have a step difference with respect to the inner surface of the inorganic layer 208 in the center direction of the second opening OP2.

The groove G having the above structure may be formed before the process of forming the intermediate layer 222 (see FIG. 6) and the second electrode 223. Among the layers formed over the substrate 100 (see FIG. 6), a layer including an organic material may become a moisture propagation path. For example, the moisture flowing in from the transmission area TA (see FIG. 6) may penetrate into the display area DA in a direction parallel to the upper surface of the substrate 100 through the organic material layer formed over the substrate 100. According to embodiments, the organic material layer, for example, the first common layer 222a and/or the second common layer 222c, may be disconnected or separated by the groove G. The first common layer 222a and/or the second common layer 222c may be formed by thermal deposition, and when the first common layer 222a and/or the second common layer 222c is deposited, the first common layer 222a and/or the second common layer 222c may be discontinuously formed by being disconnected by the groove G. Similarly, the second electrode 223 and/or the capping layer may also be formed by thermal deposition and may be discontinuously formed by being disconnected by the groove G.

Moreover, the first inorganic encapsulation layer 310, the second inorganic encapsulation layer 330 (see FIG. 6), and the first insulating layer 410 (see FIG. 6), which have a relatively excellent step coverage, may be continuously formed along the shape of the groove G instead of being disconnected by the groove G. Particularly, the first inorganic encapsulation layer 310, the second inorganic encapsulation layer 330, and the first insulating layer 410 may extend from the display area DA (see FIG. 6) to the intermediate area MA and may continuously cover the upper surface of the inorganic layer 208, the inner surface of the inorganic layer 208, the inner surface of the metal layer ML, and the bottom surface of the groove G.

FIGS. 8 to 12 are cross-sectional views sequentially illustrating a method of manufacturing a display panel according to some embodiments. For convenience, FIGS. 8 to 12 may correspond to enlarged views illustrating a region where the groove G (see FIG. 6) is arranged, and at least some of the configurations may be formed together with the configurations illustrated in FIGS. 8 to 12.

A method of manufacturing a display panel 10 (see FIG. 2) according to some embodiments may include forming a groove G and forming a light emitting device.

Also, the forming of the groove G (see FIG. 6) may include forming a metal layer ML including a first opening OP1 in an intermediate area MA (see FIG. 6) of a substrate 100 (see FIG. 6), forming an inorganic layer 208 including a second opening OP2 exposing a portion of a third sublayer sML3 over the metal layer ML, etching the third sublayer sML3 exposed by the second opening OP2, and etching a second sublayer sML2 such that the second sublayer sML2 may include a concave portion.

Also, the forming of the light emitting device may include forming a first electrode 221 (see, FIG. 6), a second electrode 223, and an intermediate layer 222 (see FIG. 6) between the first electrode 221 and the second electrode 223 in a display area DA (see FIG. 6) surrounding the intermediate area MA (see FIG. 6).

Figure 8:
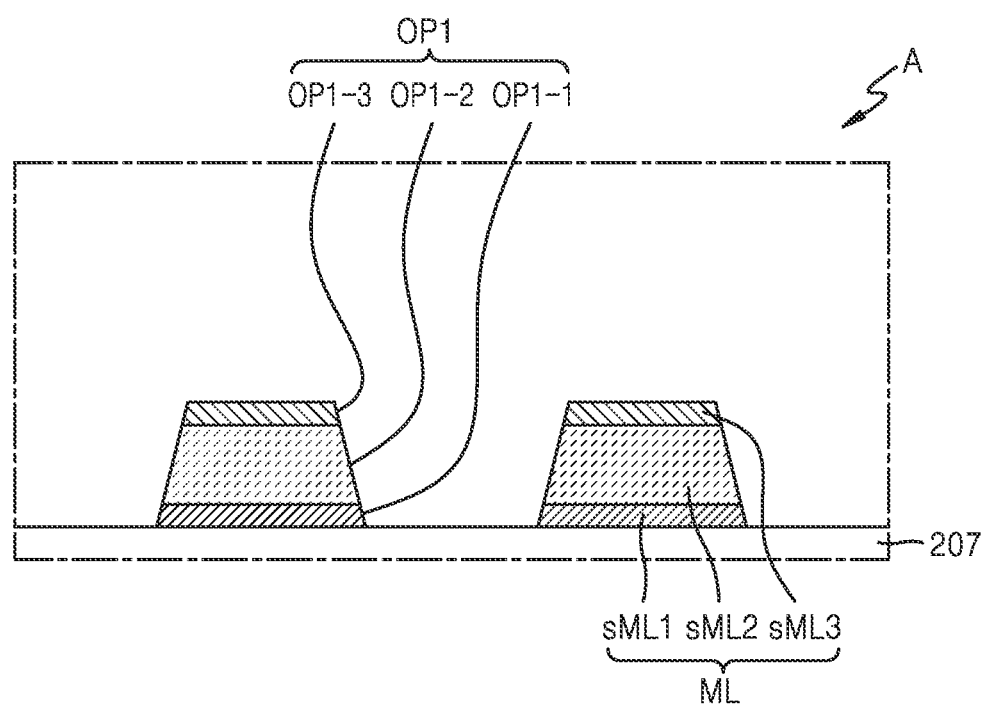
FIGS. 8 to 12 are cross-sectional views sequentially illustrating a method of manufacturing a display panel according to some embodiments.

First, as illustrated in FIG. 8, a metal layer ML including a first sublayer sML1, a second sublayer sML2, and a third sublayer sML3 sequentially stacked may be formed in the intermediate area MA (see FIG. 6) surrounding a transmission area TA (see FIG. 6) of the substrate 100 (see FIG. 6), and a first opening OP1 may be formed corresponding to a portion in which a groove G (see FIG. 12) is to be arranged. Here, the first opening OP1 may include a first sub-opening OP1-1 of the first sublayer sML1, a second sub-opening OP1-2 of the second sublayer sML2, and a third sub-opening OP1-3 of the third sublayer sML3 that overlap each other.

Moreover, according to some embodiments, a source electrode SE (see FIG. 6) and a drain electrode DE (see FIG. 6) may be simultaneously (or concurrently) formed in the display area DA (see FIG. 6) in the process of forming the metal layer ML. In this case, the metal layer ML, the source electrode SE, and the drain electrode DE may have the same layer structure and may include the same material. For example, the metal layer ML may include a first sublayer sML1, a second sublayer sML2, and a third sublayer sML3 that are sequentially stacked, and each of the source electrode SE and the drain electrode DE may include a first conductive layer e1 (see FIG. 6), a second conductive layer e2 (see FIG. 6), and a third conductive layer e3 (see FIG. 6). In this case, the first sublayer sML1 and the first conductive layer e1 include titanium (Ti), the second sublayer sML2 and the second conductive layer e2 include aluminum (Al), and the third sublayer sML3 and the third conductive layer e3 may include titanium (Ti).

Figure 9:
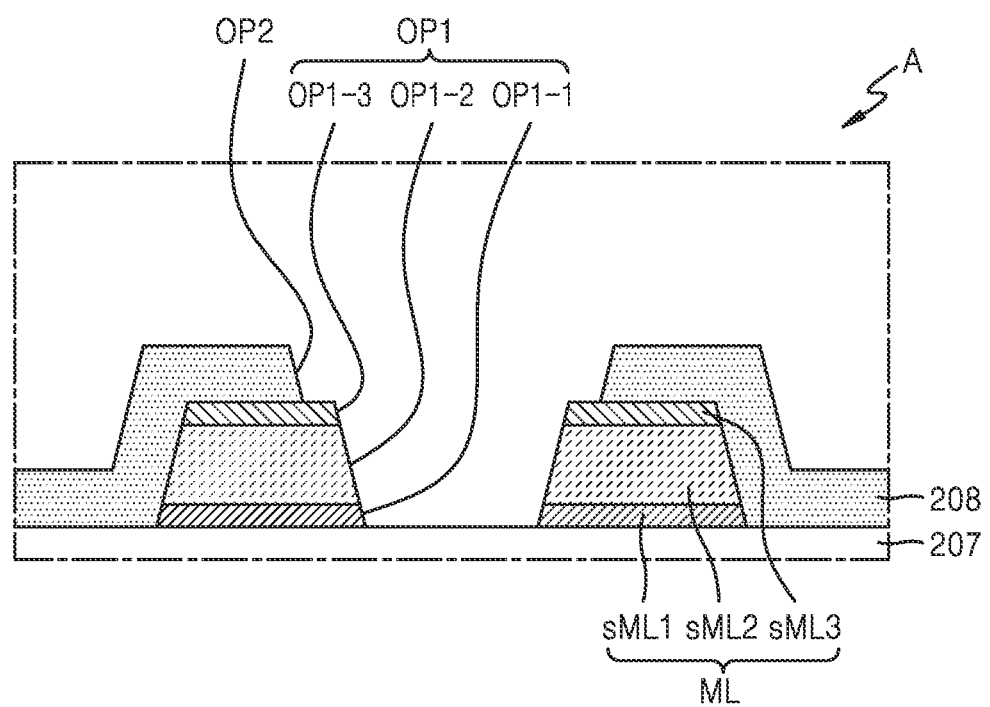

Subsequently, as illustrated in FIG. 9, an inorganic layer 208 covering at least a portion of the metal layer ML may be formed. The inorganic layer 208 may cover the side surface of the metal layer ML and a portion of the upper surface of the metal layer ML. The inorganic layer 208 may include a second opening OP2 exposing a portion of the upper surface of the metal layer ML, that is, the upper surface of the third sublayer sML3. The second opening OP2 may overlap the first opening OP1.

Moreover, according to some embodiments, the inorganic layer 208 may be formed to extend to the display area DA (see FIG. 6) to cover the source electrode SE (see FIG. 6) and the drain electrode DE (see FIG. 6).

Figure 10:
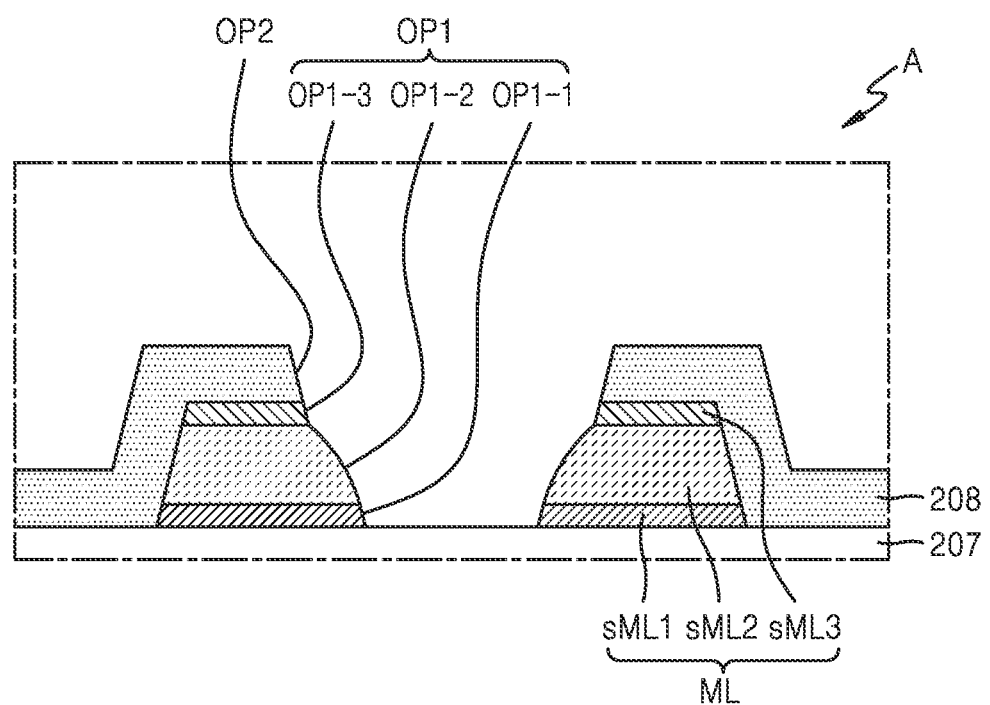

Subsequently, as illustrated in FIG. 10, the third sublayer sML3 exposed by the second opening OP2 may be etched. The process of etching a portion of the third sublayer sML3 may be performed simultaneously (or concurrently) with any one of the subsequent processes performed after the inorganic layer 208 is formed. For example, the third sublayer sML3 exposed by the second opening OP2 may be etched by being exposed to an etchant in the process of etching the contact metal layer CM (see FIG. 6) described above. That is, the third sublayer sML3 and the contact metal layer CM may be simultaneously (or concurrently) etched in one process.

Moreover, a portion of the third sublayer sML3 that is not exposed by the second opening OP2 and is covered by the inorganic layer 208 may be preserved by not being exposed to the etchant by being masked by the inorganic layer 208. That is, the inorganic layer 208 may function as a mask in the process of etching a portion of the third sublayer sML3.

Because the inorganic layer 208 functions as a mask, the metal layer ML and the inorganic layer 208 may be aligned with each other. Also, the inorganic layer 208 may include a pair of tips aligned with the edge of the upper surface of the metal layer ML. The pair of tips of the inorganic layer 208 may allow the concave portion (or undercut structure) to be more clearly formed in the subsequent process of forming the concave portion (or undercut structure) by etching the second sublayer sML2. Moreover, because this process is performed simultaneously (or concurrently) with the process of patterning the contact metal layer CM, it may be unnecessary to perform a separate process for alignment of the metal layer ML and the inorganic layer 208 and thus the process efficiency may be improved.

According to some embodiments, the edge of the upper surface of the third sublayer sML3 in the center direction of the third sub-opening OP1-3 may be formed to match the edge of the inorganic layer 208 in the center direction of the second opening OP2. The inner surface of the third sublayer sML3 in the center direction of the opening OP1-3 may not have a step difference with respect to the inner surface of the inorganic layer 208 in the center direction of the second opening OP2.

Moreover, referring to FIG. 10, in this process, a portion of the inner surface of the second sublayer sML2 located under the third sublayer sML3 may also be etched.

Figure 11:
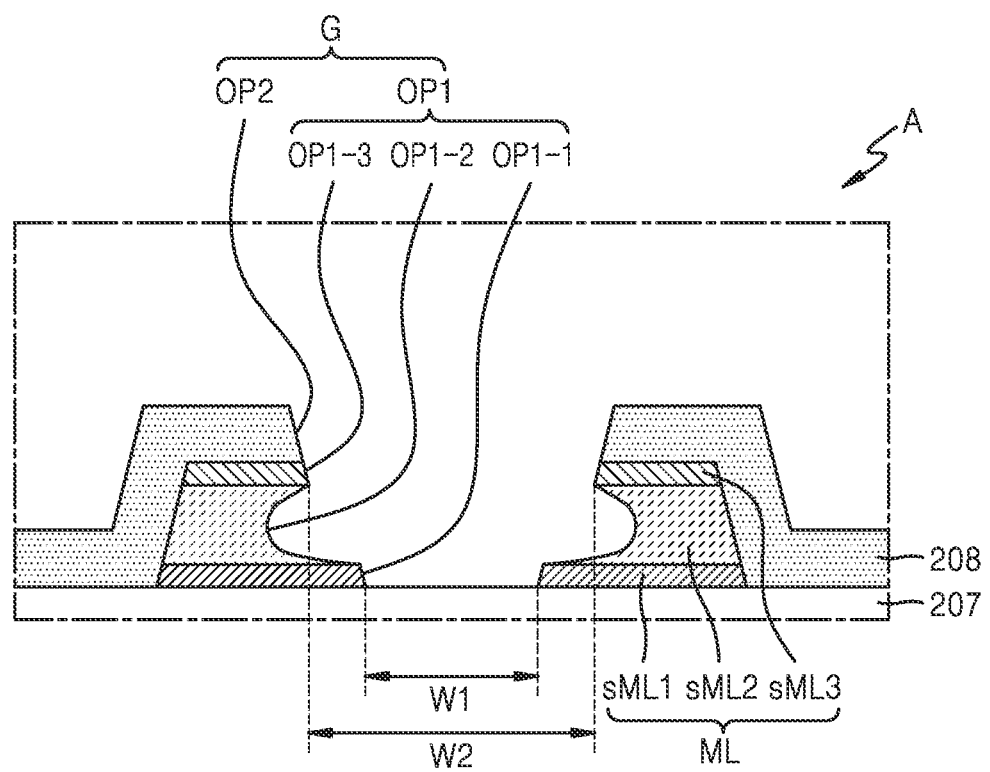

Subsequently, as illustrated in FIG. 11, the second sublayer sML2 may be etched such that the inner surface of the second sublayer sML2 may include a concave portion recessed in a direction farther away from the center of the first opening OP1 than the inner surface of the first sublayer sML1 and the inner surface of the third sublayer sML3.

The process of etching the inner surface of the second sublayer sML2 may be performed simultaneously (or concurrently) with any one of the subsequent processes performed after the process of etching a portion of the third sublayer sML3 described above. For example, the inner surface of the second sublayer sML2 may be etched by being exposed to an etchant in the process of etching the first electrode 221 (see FIG. 6) of the light emitting device described above. That is, the second sublayer sML2 may be etched simultaneously (or concurrently) with the first electrode 221 in one process.

Moreover, unlike the second sublayer sML2, the first sublayer sML1 and the third sublayer sML3 may be preserved by not being etched due to an etch ratio difference thereof. For this purpose, the second sublayer sML2 may include a different material than the first sublayer sML1 and the third sublayer sML3. For example, the second sublayer sML2 may include aluminum (Al) having a relatively high etch rate, and the first sublayer sML1 and the third sublayer sML3 may include titanium (Ti) having a relatively low etch rate.

As such, because the second sublayer sML2 has a concave shape by being etched simultaneously (or concurrently) with the first electrode 221 (see FIG. 6) in the process of patterning the first electrode 221, it may be unnecessary to perform a separate process for forming a concave portion (undercut structure) of the groove G and thus the process efficiency may be improved.

According to some embodiments, the edge of the upper surface of the second sublayer sML2 in the center direction of the second sub-opening OP1-2 may match the edge of the lower surface of the third sublayer sML3 in the center direction of the third sub-opening OP1-3. Also, the edge of the lower surface of the second sublayer sML2 in the center direction of the second sub-opening OP1-2 may match the edge of the upper surface of the first sublayer sML1 in the center direction of the first sub-opening OP1-1.

Also, in the view in a direction perpendicular to the substrate 100 (see FIG. 6), the area of the third sub-opening OP1-3 of the third sublayer sML3 may be greater than the area of the first sub-opening OP1-1 of the first sublayer sML1. That is, a width W2 of the third sub-opening OP1-3 may be greater than a width W1 of the first sub-opening OP1-1 of the first sublayer sML1. Here, "the width of the opening" may refer to the distance between the inner edges of the lower surface of the layer in which the opening is formed.

Figure 12:
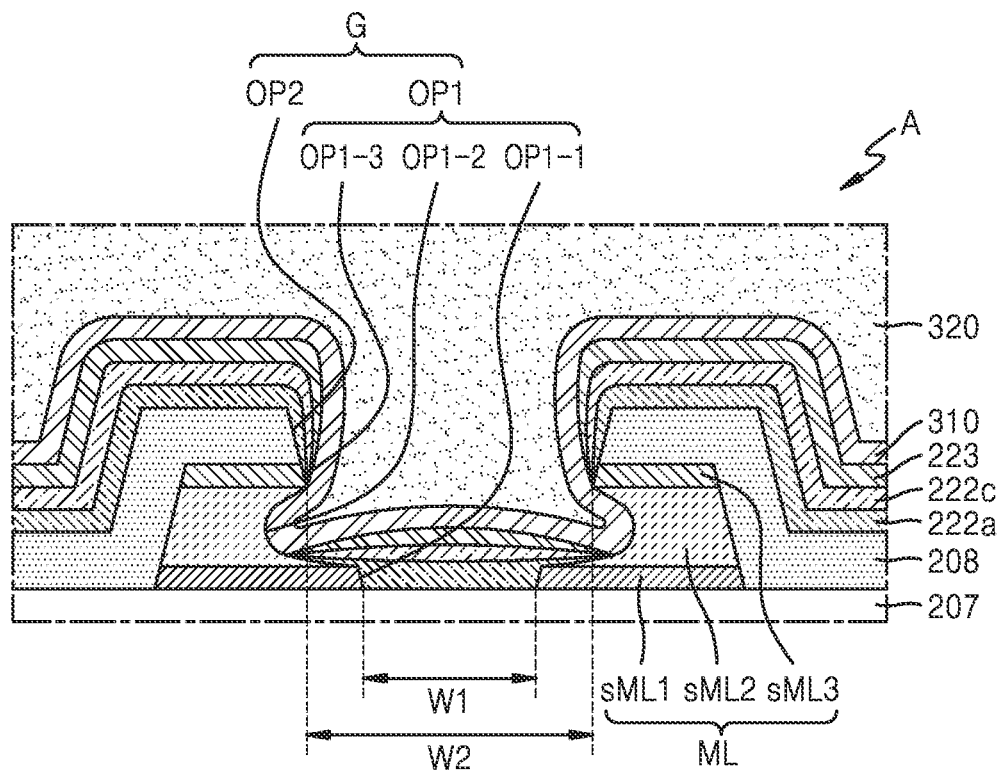

Subsequently, as illustrated in FIG. 12, an intermediate layer 222 (see FIG. 6), a second electrode 223, and an encapsulation layer 300 may be sequentially formed. The intermediate layer 222 may include a first common layer 222a and/or a second common layer 222c, and the encapsulation layer 300 (see FIG. 6) may include a first inorganic encapsulation layer 310, an organic encapsulation layer 320, and a second inorganic encapsulation layer 330.

The first common layer 222a and/or the second common layer 222c may be formed by thermal deposition, and when the first common layer 222a and/or the second common layer 222c is deposited, the first common layer 222a and/or the second common layer 222c may be discontinuously formed by being disconnected by the groove G. Similarly, the second electrode 223 and/or a capping layer may also be formed by thermal deposition and may be discontinuously formed by being disconnected by the groove G.

Moreover, the first and second inorganic encapsulation layers 310 and 330 (see FIG. 6) having a relatively excellent step coverage may be continuously formed along the shape of the groove G instead of being disconnected by the groove G. Particularly, the first and second inorganic encapsulation layers 310 and 330 may be formed to extend from the display area DA (see FIG. 6) to the intermediate area MA (see FIG. 6) and to continuously cover the upper surface of the inorganic layer 208, the inner surface of the inorganic layer 208, the inner surface of the metal layer ML, and the bottom surface of the groove G.

Subsequently, according to some embodiments, the method may further include forming the input sensing layer 40, the optical functional layer 50, and/or the cover window 60 described above as shown in FIG. 2, over the encapsulation layer 300 (see FIG. 6).

As described above, according to some embodiments, a method of manufacturing a display panel having relatively improved moisture penetration prevention performance and a display panel having an improved process efficiency may be implemented. However, the scope of embodiments according to the present disclosure is not limited to these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the attached claims, and their equivalents.

What is claimed is:

1. A display panel, wherein the display panel comprises:
a substrate including a transmission area, a display area surrounding the transmission area, and an intermediate area between the transmission area and the display area;
a light emitting device in the display area; and
a groove in the intermediate area and including a first opening of a metal layer including a first metal sublayer, a second metal sublayer, and a third metal sublayer are sequentially stacked and a second opening of an inorganic layer covering the metal layer,
wherein the first opening includes a first sub-opening of the first metal sublayer, a second sub-opening of the second metal sublayer, and a third sub-opening of the third metal sublayer, which overlap each other, and
an inner surface of the second metal sublayer includes a concave portion recessed in a direction farther away from a center of the first opening than an inner surface of the first metal sublayer and an inner surface of the third metal sublayer.

2. The display panel of claim 1, wherein the light emitting device includes a first electrode, a second electrode, and an intermediate layer between the first electrode and the second electrode, and
at least one common layer included in the intermediate layer is disconnected by the groove.

3. The display panel of claim 1, wherein an edge of an upper surface of the second metal sublayer in a center direction of the second sub-opening matches an edge of a lower surface of the third metal sublayer in a center direction of the third sub-opening, and
an edge of a lower surface of the second metal sublayer in a center direction of the second sub-opening matches an edge of an upper surface of the first metal sublayer in a center direction of the first sub-opening.

4. The display panel of claim 3, wherein a width of the third sub-opening is greater than a width of the first sub-opening.

5. The display panel of claim 3, wherein an edge of an upper surface of the third metal sublayer in a center direction of the third sub-opening matches an edge of a lower surface of the inorganic layer in a center direction of the second opening.

6. The display panel of claim 1, wherein the display panel further comprises a thin film transistor located in the display area and electrically connected to the light emitting device,
wherein each of a source electrode and a drain electrode of the thin film transistor includes a first conductive layer, a second conductive layer, and a third conductive layer, which are sequentially stacked.

7. The display panel of claim 6, wherein the first metal sublayer and the first conductive layer include a same material,
the second metal sublayer and the second conductive layer include a same material, and
the third metal sublayer and the third conductive layer include a same material.

8. The display panel of claim 7, wherein the inorganic layer extends to the display area to cover the source electrode and the drain electrode.

9. The display panel of claim 1, wherein the display panel further comprises an encapsulation layer covering the light emitting device and including at least one inorganic encapsulation layer,
   wherein the at least one inorganic encapsulation layer extends from the display area to the intermediate area to continuously cover an upper surface of the inorganic layer, an inner surface of the inorganic layer, an inner surface of the metal layer, and a bottom surface of the groove.

10. The display panel of claim 1, wherein the display panel further comprises a partition wall in the intermediate area,
   wherein the groove is at least one of between the partition wall and the display area and between the partition wall and the transmission area.

* * * * *